United States Patent
Duvillaret et al.

(10) Patent No.: US 8,264,685 B2
(45) Date of Patent: Sep. 11, 2012

(54) ELECTROOPTIC PROBE FOR VECTOR MEASUREMENT OF AN ELECTROMAGNETIC FIELD

(75) Inventors: Lionel Duvillaret, Chambery (FR); Gwenaël Gaborit, Chambery (FR)

(73) Assignees: Institut National Polytechnique de Grenoble, Grenoble Cedex (FR); Universite de Savoie, Chambery Cedex (FR)

( * ) Notice: Subject to any disclaimer, the term of this patent is extended or adjusted under 35 U.S.C. 154(b) by 669 days.

(21) Appl. No.: 12/305,066

(22) PCT Filed: Jun. 15, 2007

(86) PCT No.: PCT/FR2007/051445
§ 371 (c)(1), (2), (4) Date: Mar. 19, 2009

(87) PCT Pub. No.: WO2007/144547
PCT Pub. Date: Dec. 21, 2007

(65) Prior Publication Data
US 2009/0262349 A1 Oct. 22, 2009

(30) Foreign Application Priority Data
Jun. 16, 2006 (FR) ...................... 06 52157

(51) Int. Cl.
*G01J 4/00* (2006.01)
(52) U.S. Cl. ............. 356/364; 385/11; 385/15; 356/368
(58) Field of Classification Search .................... None
See application file for complete search history.

(56) References Cited

U.S. PATENT DOCUMENTS 4,215,576 A * 8/1980 Quick et al. .................. 356/365
(Continued)

FOREIGN PATENT DOCUMENTS
EP 0453693 A1 10/1991
(Continued)

OTHER PUBLICATIONS

Hidaka, K et al., "Simultaneous measurement of two orthogonal components of electric field using a Pockels device", Review of Scientific Instruments, AIP, Melville, NY, US vol. 60, No. 7, Part 1, Jul. 1, 1989, pp. 1252-1257.

(Continued)

*Primary Examiner* — Gregory J Toatley
*Assistant Examiner* — Juan D Valentin
(74) *Attorney, Agent, or Firm* — Howard IP Law Group, P.C.

(57) ABSTRACT

A device for measuring two components of an electromagnetic field in an analysis zone includes a light source for sending a polarized light beam into a polarization-maintaining optical fiber. The beam is directed along one axis of the fiber. An isotropic electrooptic material is placed in the zone for receiving the beam from the optical fiber via a substantially quarter-wave plate, which has its axes oriented at an angle of substantially 45° to the axes of the optical fiber and for sending a beam into the fiber. The plate is slightly detuned in regard to its characteristics or its orientation. The device further includes a phase-shifter for phase-shifting the beam sent into the fiber, wherein the phase-shifter is set so as to impose a phase shift equal and opposite to that imposed by the fiber and mechanism for analyzing the orientation and ellipticity of the wave exiting the phase-shifter.

7 Claims, 1 Drawing Sheet

U.S. PATENT DOCUMENTS

| | | | |
|---|---|---|---|
| 5,157,324 | A | 10/1992 | Chollet |
| 5,737,082 | A | 4/1998 | Itatani et al. |
| 5,880,838 | A * | 3/1999 | Marx et al. ............... 356/498 |
| 5,952,818 | A * | 9/1999 | Zhang et al. ............... 324/96 |
| 6,680,798 | B2 * | 1/2004 | Kreuzer ............... 359/489.03 |
| 7,769,250 | B2 * | 8/2010 | Duvillaret et al. ............ 385/11 |
| 2002/0036491 | A1 * | 3/2002 | Whitaker et al. ............ 324/96 |
| 2006/0114003 | A1 * | 6/2006 | Onishi et al. ............... 324/632 |

FOREIGN PATENT DOCUMENTS

| | | |
|---|---|---|
| EP | 0458255 A2 | 11/1991 |
| FR | 2751409 A1 | 1/1998 |
| JP | 2005214892 A | 8/2005 |

OTHER PUBLICATIONS

International Search Report dated Nov. 27, 2007.

* cited by examiner

ELECTROOPTIC PROBE FOR VECTOR MEASUREMENT OF AN ELECTROMAGNETIC FIELD

This application is the national stage application under 35 U.S.C. §371 of International Application No. PCT/FR2007/051445 and claims the benefit of Intl. Application No. PCT/FR2007/051445, filed Jun. 15, 2007 and French Application No. 06/52157, filed Jun. 16, 2006, the entire disclosures of which are incorporated herein by reference in their entireties.

FIELD OF THE INVENTION

The present invention relates to the measurement of electromagnetic fields in analysis areas of small dimensions.

In the present application, "electromagnetic field" or, simply, "field" will designate an actual electromagnetic field or a pure magnetic field, or a pure electric field.

DISCUSSION OF PRIOR ART

One of the difficulties when an electromagnetic field is desired to be measured is that this field is likely to directly react on the circuits of the measurement instruments used to measure it or to be influenced by said instruments. To avoid this disadvantage, optical detection systems have been provided, in which the field reacts on a light beam crossing an electro-optical crystal. In an electro-optical crystal, the field essentially acts on the polarization of a light beam. Optical waves with a rectilinear polarization, with a circular polarization, and with an elliptical polarization will here be mentioned. To avoid burdening the present description, it will be spoken, as often done in current practice, of rectilinear, circular, or elliptical waves, and it should be understood that these waves are, each time, optical waves having a respectively rectilinear, circular, or elliptical polarization.

An example of a conventional electromagnetic field optical measurement device is illustrated in FIG. 1. The detector is formed of an electro-optical crystal 1 having an end 2 comprising a reflecting surface and having its other end coupled by a coupler 3 to one end of a polarization-maintaining optical fiber 5. Polarized light is sent by a source of polarized light, coherent or not, for example comprising a light-emitting diode 7 and a polarizer 8, to the other end of optical fiber 5 via a coupler 9.

The light reflected by mirror 2 and thus having crossed crystal 1 twice and fiber 5 twice is collected by a beam splitter 11 and sent into a polarization analysis assembly, for example comprising a quarter-wave plate (or λ/4 plate) 13, a half-wave plate (or λ/2 plate) 14 and a polarizer 15, each of these elements being individually settable to rotate, either manually or under the effect of a control device 17. It should be noted that, usually, in the field of anisotropic optics, "polarizer" will be used to designate an element likely to set the polarization of the light crossing it towards a device using this light, and "analyzer" will be used to designate this same device when it is placed on the side of the detector of a system, and is used for the analysis of the polarization of the light that it receives. In the present description, term "polarizer" will always be used, be it placed in a position where it sets the polarization or in a position where it analyzes the polarization of the light that it receives, given that it effectively is the same hardware device. Term "analyzer" will be reserved to an assembly of analysis of the polarization state of a light wave, comprising the assembly of λ/4 plate 13, of λ/2 plate 14, and of polarizer 15.

At the output of polarizer 15 is arranged a detector 19, which provides on a terminal 20 a signal proportional to the intensity of the wave incident on polarizer 15 in the polarization direction of this polarizer. It should be understood by those skilled in the art that, in the absence of a field at the level of sensor 1, optical fiber 5 will transmit to crystal 1 a wave with a rectilinear polarization along the direction of an axis of the polarization-maintaining fiber (if polarizer 8 is aligned along one of the two axes of fiber 5). This polarization state will be modified by the anisotropic crystal which will send an elliptical wave back into the fiber. Analyzer 13-15 is set in the absence of a field to set a reference point. Then, when a field is applied on crystal 1, this modifies the crystal indexes and the polarization of the wave received at the level of analyzer 13-15 changes. This modification is characteristic of the field applied at the level of the sensor and may be detected by analyzer 13-15.

It should be reminded that only one component of the field, parallel to a sensitivity vector characteristic of the used electro-optical crystal, is measured by this type of device.

Various means have been suggested to optimize the measurement. For example, it will be preferred for the axes of electro-optical crystal 2 form a 45° angle with the axes of the polarization-maintaining fiber.

A device of the type described hereinabove a priori provides good results, especially due to the fact that it enables for the elements requiring the presence of electric currents, comprising light source 7, photoreceptor 19, and the circuits not shown for analyzing its output signal 20 to be distant from the area where the field is measured. Thus, these elements are not disturbed by the field to be measured, no more than they disturb this field. It can however be observed that the setting of the device, and especially the setting of the above-mentioned reference point, considerably drifts along time, especially when the optical fiber is too long. It can have been noted that this drifting is especially linked to temperature fluctuations. Thus, a same field risks being measured as having different values if the temperature has varied without it being noticed. A readjustment of the setting of the reference point of analyzer 13-15 must thus be performed very often to obtain a reliable reference, and this empirical setting is relatively long and difficult.

SUMMARY OF THE INVENTION

The present invention aims at overcoming at least some of the disadvantages of optical field measurement devices and especially at getting rid of the effects induced by a temperature variation of the fiber.

The present invention further aims at providing an analysis system which is particularly simple to use.

The present invention also aims at providing two field components at the level of the analysis area.

To achieve all or part of these and other objects, the present invention provides a device for measuring two components of an electromagnetic field in an analysis area, comprising: a light source sending into a polarization-maintaining optical fiber a light beam polarized along an axis of the fiber; an isotropic electro-optical material arranged in said area, receiving the beam from the optical fiber via a λ/4 plate having its axes oriented at a 45° angle with respect to the axes of the optical fiber and sending back a beam into this fiber, the plate being slightly out of adjustment as to its characteristic or its orientation; means for shifting the phase of the beam sent back into the fiber, set to impose a phase shift equal and opposite to that imposed between the two polarizations aligned along the specific dielectric axes of the fiber; means for analyzing the orientation and the ellipticity of the wave coming out of the phase-shift means, the orientation and the ellipticity being linked by non-trivial relations to the orientation and to the intensity of the field in the analysis area.

According to an embodiment of the present invention, the analysis means comprise a λ/4 plate, and polarizers respectively arranged on two distinct paths between the quarter-wave plate and intensity detectors.

According to an embodiment of the present invention, the phase-shift means comprise a λ/4 plate and a λ/2 plate.

According to an embodiment of the present invention, the phase-shift means comprise a Soleil-Babinet compensator.

A method for setting the phase-shift means of the device comprises the steps of:

arranging a polarizer behind the phase-shift means at 45° with respect to the reference polarization defined by an axis of the fiber, and setting the phase-shift means so that the polarizer transmits half of the light that it receives.

BRIEF DESCRIPTION OF THE DRAWINGS

The foregoing objects, features, and advantages of the present invention, as well as others, will be discussed in detail in the following non-limiting description of specific embodiments in connection with the appended drawings, among which.

DETAILED DESCRIPTION

Figure 1:
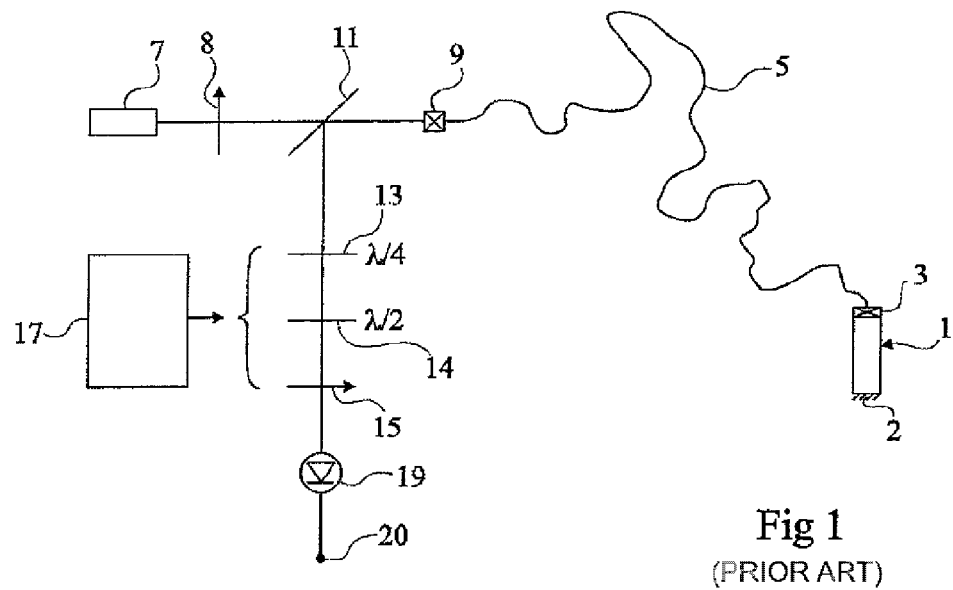
FIG. 1 schematically shows a device for measuring an electromagnetic field with an electro-optical effect crystal according to prior art.
Figure 2:
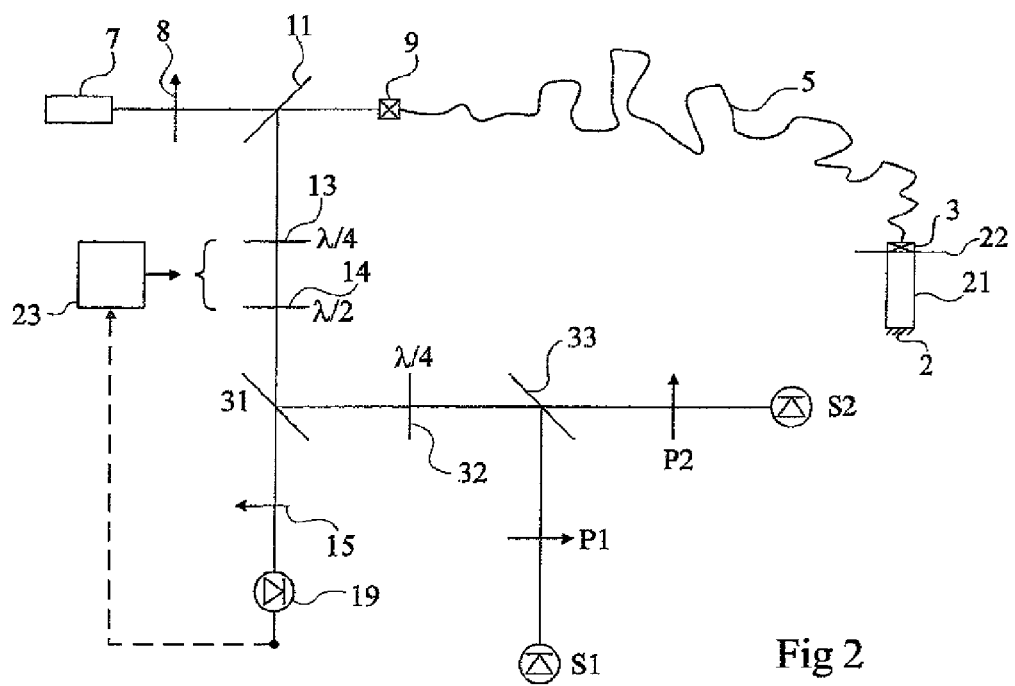
FIG. 2 schematically shows an embodiment of a device for measuring an electromagnetic field with an electro-optical effect crystal according to the present invention.

The present invention, an embodiment of which is illustrated in FIG. 2, uses a hardware device having elements identical to those shown in FIG. 1. These elements have been designated with same reference numerals and will not be described again.

According to the present invention, a crystal 21, which is isotropic in the absence of a field and becomes anisotropic in the presence of a field, for example, a crystal or gallium arsenide or zinc telluride type, is used as an electro-optical effect crystal.

Between crystal 21 and fiber 5 is inserted a quarter-wave plate 22 oriented at 45° with respect the fiber axes. This plate must either not be exactly quarter wave or not be exactly oriented at 45° with respect to the fiber axes. Then, the polarization sent into the crystal will be a nearly circular polarization. The crystal axes may be arranged at any angle with respect to the fiber axes and the quarter-wave plate.

The beam sent back by crystal 21 into fiber 5 is deviated by beam splitter 11 towards a phase-shift assembly, for example comprising a quarter-wave plate (or λ/4 plate) 13 and a half-wave plate (or λ/2 plate) 14. It should be noted that, in the absence of a field, and since crystal 21 is isotropic, the wave coming out of beam splitter 11 would be rectilinear if plate 22 was perfectly quarter-wave and exactly at 45°. Due to the intentionally-imperfect character of λ/4 plate 22, this wave is slightly elliptical, for example exhibiting an orthogonal component having an intensity of a few percents of its main component.

The output beam of phase-shifter 13-14 is sent onto a polarizer 15 and a detector 19. The inventor has been able to show that the polarization state at the output of the phase-shifter assembly, when an electric field is applied on crystal 21, is provided by the following expressions:

$$Ex = (1 - e^{j\varphi E}) \cdot e^{-j(\alpha + \frac{\gamma+\theta}{2})} \quad (1)$$

$$Ey = (1 + e^{j\varphi E}) \cdot e^{+j(\alpha + \frac{\gamma+\theta}{2})}$$

by using the following notations:

j: the number having a square equal to −1,

Ex, Ey: orthogonal polarization components,

θ: phase shift introduced by polarization-maintaining fiber 5 between the polarizations aligned along its specific dielectric axes (this phase shift varies along with the temperature of the fiber), $\phi_E$: phase shift introduced in the presence of a field between the polarizations oriented according to the dielectric axes of the crystal by a return travel in the material of the electro-optical crystal, noting that $\phi_E$ is always very small as compared to $2\pi$, γ: phase shift introduced by the phase shifter corresponding to the assembly of λ/4 and λ/2 plates 13 and 14, and α: angular value depending on the orientation of the electromagnetic field with respect to the axes of crystal 21.

It can be seen that if γ is set to be equal to −θ, the polarization state at the output of analyzer 13-14 becomes independent from θ, that is, from the parameters of the optical fiber, and especially from the variations of θ, that is, from the fiber temperature. Equations (1) then become:

$$Ex = (1 - e^{j\phi_E}) \cdot e^{-j\alpha}$$

$$Ey = (1 + e^{j\phi_E}) \cdot e^{j\alpha} \quad (2)$$

It should further be noted that, since $\phi_E$ is always very small as compared to 1, the obtained wave is practically rectilinear.

To make sure that γ=−θ, according to an embodiment of the present invention, the intensity received by detector 19 located behind polarizer 15 is measured. Intensity I is provided by:

$$I = \cos^2 \Psi + \delta \sin(\gamma+\theta) \sin^2 \Psi \quad (3)$$

where:

Ψ defines the orientation of polarizer 15,

δ defines the phase shift linked to the imperfection of plate 22.

If polarizer 15 is set to 45° with respect to the polarization direction imposed by input polarizer 8, equation (3) becomes:

$$I = 1/2 + \delta \sin(\gamma+\theta) \quad (4)$$

It is thus verified that condition γ=−θ is satisfactory when, after the setting of analyzer 13-14, the output power of polarizer 15 (set to 45°) is equal to half of what it would be in the absence of this polarizer. The output of detector 19 may be used by a controller 23 acting on analyzer 13-14 so that this condition is permanently fulfilled. Then, as indicated previously, the analyzed signal will be independent from the temperature variations of fiber 5.

Further, the output wave of analyzer 13-14, which is provided by:

$$Ex = (1 e^{j\phi_E}) e^{-j\alpha}$$

$$Ey = (1 + e^{j\phi_E}) e^{j\alpha} \quad (2)$$

is deviated by a beam splitter 31 towards a device for analyzing this ellipticity.

It should be reminded that $\phi_E$ characterizes the intensity of the field on sensor 21 and that α characterizes the orientation of the field with respect to the axes of crystal 21. $\phi_E$ and α are linked by non-trivial relations to the ellipticity and to the orientation with respect to the reference direction of polarization of the output wave of the phase shifter.

Many types of polarization analyzers may be used to determine $\phi_E$ and $\alpha$. An example thereof is given in FIG. 2 and comprises a $\lambda/4$ plate 32 transforming the flattened elliptical wave into a nearly circular wave, and this nearly circular wave is sent via a beam splitter 33 on two paths, towards detectors S1 and S2 via polarizers P1 and P2 of orientation $\Psi 1$ and $\Psi 2$.

On detectors S1 and S2, respective signals P1 and P2 such as follows are obtained:

$$Pi = [1 - \sin \phi_E \cdot \cos 2(\Psi i + \alpha)]/2, \text{ with } i=1 \text{ or } 2.$$

Then, taking for example $\Psi 1 = 0$ and $\Psi 2 = \pi/4$:

$$\sin \phi_E = [(2P1-1)^2 + (2P2-1)^2]^{1/2}, \text{ and}$$

$$\tan 2\alpha = -(2P2-1)/(2P1-1)$$

Further, the present invention is likely to have many particularities or variations, among which the following can be mentioned without being limiting.

1. To shift the phase of the received wave, instead of using a $\lambda/4$ plate 13 and a $\lambda/2$ plate 14, any known phase shift device may be used, such as for example a Soleil-Babinet compensator. This compensator will be easier to control with control device 23.
2. If the field applied to sensor 21 is an alternating field of given frequency, synchronous detections of the output signal of sensors S1 and S2 will preferably be performed.
3. To increase the sensitivity, elements forming an antenna may be associated with the sensor crystal.

It should be understood by those skilled in the art that it is equivalent to speak of measurement of two components of a field or of measurement of the intensity of a field and of its orientation, or of vectorial measurement of a field.

Of course, the present invention is likely to have all other variations and modifications which will occur to those skilled in the art.

The invention claimed is:

1. A device for measuring two components of an electromagnetic field in an analysis area, comprising:
   a light source for sending into a polarization-maintaining optical fiber a light beam polarized along axes of the fiber;
   an electro-optical material arranged in said area, said material being isotropic in the absence of an electromagnetic field and becoming anisotropic in the presence of an electromagnetic field, for receiving the light beam from the optical fiber via a substantially quarter-wave plate having its axes oriented at a substantially 45° angle with respect to the axes of the optical fiber and for sending back the beam into the fiber;
   a phase shifter for shifting the phase of the light beam sent back into the fiber, said phase shifter set to impose a phase shift equal and opposite to that imposed between the polarizations aligned along the axes of the fiber; and
   an analyzer for analyzing an orientation and an ellipticity of the light beam coming out of the phase shifter, the orientation and the ellipticity being respectively linked to the orientation and to the intensity of the electromagnetic field in the analysis area,
   wherein the substantially quarter-wave plate is defined as having a phase shift approaching but not equal to one quarter-wavelength.

2. A device for measuring two components of an electromagnetic field in an analysis area, comprising:
   a light source for sending into a polarization-maintaining optical fiber a light beam polarized along axes of the fiber;
   an electro-optical material arranged in said area, said material being isotropic in the absence of an electromagnetic field and becoming anisotropic in the presence of an electromagnetic field, for receiving the light beam from the optical fiber via a substantially quarter-wave plate having its axes oriented at a substantially 45° angle with respect to the axes of the optical fiber and for sending back the beam into the fiber;
   a phase shifter for shifting the phase of the light beam sent back into the fiber, said phase shifter set to impose a phase shift equal and opposite to that imposed between the polarizations aligned along the axes of the fiber; and
   an analyzer for analyzing an orientation and an ellipticity of the light beam coming out of the phase shifter, the orientation and the ellipticity being respectively linked to the orientation and to the intensity of the electromagnetic field in the analysis area,
   wherein the analyzer comprises a second quarter-wave plate, a beam splitter, and first and second polarizers respectively arranged on first and second distinct paths between the beam splitter and first and second intensity detectors.

3. The device of claim 1, wherein the phase shifter comprises a quarter-wave plate and a half-wave plate.

4. The device of claim 1, wherein the phase shifter comprises a Soleil-Babinet compensator.

5. A method for using a device for measuring two components of an electromagnetic field in an analysis area, said device comprising:
   a light source for sending into a polarization-maintaining optical fiber a light beam polarized along axes of the fiber;
   an electro-optical material arranged in said area, said material being isotropic in the absence of an electromagnetic field and becoming anisotropic in the presence of an electromagnetic field, for receiving the light beam from the optical fiber via a substantially quarter-wave plate having its axes oriented at a substantially 45° angle with respect to the axes of the optical fiber and for sending back the light beam into the fiber;
   a phase shifter for shifting the phase of the light beam sent back into the fiber, said phase shifter set to impose a phase shift equal and opposite to that imposed between the polarizations aligned along the axes of the fiber; and
   an analyzer for analyzing an orientation and an ellipticity of the light beam coming out of the phase shifter, the orientation and the ellipticity being respectively linked to the orientation and to the intensity of the field in the analysis area;
   wherein said method comprises the steps of:
   arranging a polarizer behind the phase shifter at 45° with respect to the reference polarization defined by an axis of the fiber, and
   setting the phase shifter so that the polarizer transmits half of the light that it receives,
   wherein the substantially quarter-wave plate is defined as having a phase shift approaching but not equal to one quarter-wavelength.

6. A device for measuring two components of an electromagnetic field in an analysis area, comprising:
   a light source for sending into a polarization-maintaining optical fiber a light beam polarized along axes of the fiber;

an electro-optical material arranged in said area, said material being isotropic in the absence of an electromagnetic field and becoming anisotropic in the presence of an electromagnetic field, for receiving the light beam from the optical fiber via a substantially quarter-wave plate having its axes oriented at a substantially 45° angle with respect to the axes of the optical fiber and for sending back the beam into the fiber;

a phase shifter for shifting the phase of the light beam sent back into the fiber, said phase shifter set to impose a phase shift equal and opposite to that imposed between the polarizations aligned along the axes of the fiber; and an analyzer for analyzing an orientation and an ellipticity of the light beam coming out of the phase shifter, the orientation and the ellipticity being respectively linked to the orientation and to the intensity of the electromagnetic field in the analysis area, wherein the substantially quarter-wave plate has its axes oriented at substantially but not equal to a 45° angle.

7. A method for using a device for measuring two components of an electromagnetic field in an analysis area, said device comprising:

a light source for sending into a polarization-maintaining optical fiber a light beam polarized along axes of the fiber;

an electro-optical material arranged in said area, said material being isotropic in the absence of an electromagnetic field and becoming anisotropic in the presence of an electromagnetic field, for receiving the light beam from the optical fiber via a substantially quarter-wave plate having its axes oriented at a substantially 45° angle with respect to the axes of the optical fiber and for sending back the light beam into the fiber;

a phase shifter for shifting the phase of the light beam sent back into the fiber, said phase shifter set to impose a phase shift equal and opposite to that imposed between the polarizations aligned along the axes of the fiber; and an analyzer for analyzing an orientation and an ellipticity of the light beam coming out of the phase shifter, the orientation and the ellipticity being respectively linked to the orientation and to the intensity of the field in the analysis area;

wherein said method comprises the steps of:

arranging a polarizer behind the phase shifter at 45° with respect to the reference polarization defined by an axis of the fiber, and setting the phase shifter so that the polarizer transmits half of the light that it receives, wherein the substantially quarter-wave plate has its axes oriented at substantially but not equal to a 45° angle.

* * * * *